(12) United States Patent
Lee

(10) Patent No.: US 12,424,252 B2
(45) Date of Patent: Sep. 23, 2025

(54) SEMICONDUCTOR MEMORY DEVICE FOR DETERMINING OPERATION STATE WITH DETECTING FREQUENCY OF INPUT CLOCK SIGNAL

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 295 days.

(21) Appl. No.: 18/314,544

(22) Filed: May 9, 2023

(65) Prior Publication Data

US 2024/0071444 A1 Feb. 29, 2024

(30) Foreign Application Priority Data

Aug. 29, 2022 (KR) .......... 10-2022-0108065

(51) Int. Cl.
| | | |
|---|---|---|
| *G11C 7/22* | (2006.01) | |
| *G11C 11/406* | (2006.01) | |
| *G11C 11/4076* | (2006.01) | |
| *G11C 29/02* | (2006.01) | |
| *H03K 5/135* | (2006.01) | |
| *H03K 5/24* | (2006.01) | |

(52) U.S. Cl.
CPC ........ *G11C 7/222* (2013.01); *G11C 11/40611* (2013.01); *G11C 11/4076* (2013.01); *G11C 29/023* (2013.01); *H03K 5/135* (2013.01); *H03K 5/2427* (2013.01); *G11C 11/40615* (2013.01)

(58) Field of Classification Search
CPC ............. G11C 7/222; G11C 11/40611; G11C 11/4076; G11C 29/023; G11C 11/40615; G11C 7/1045; H03K 5/135; H03K 5/2427; H03K 5/133; H03K 5/22
See application file for complete search history.

(56) References Cited

U.S. PATENT DOCUMENTS

| | | | | |
|---|---|---|---|---|
| 2012/0297232 A1* | 11/2012 | Bircher | ................... | G06F 1/324 |
| | | | | 713/500 |
| 2023/0061738 A1* | 3/2023 | Kim | ..................... | G11C 7/1087 |

* cited by examiner

*Primary Examiner* — Donald HB Braswell
(74) *Attorney, Agent, or Firm* — KILE PARK REED & HOUTTEMAN PLLC

(57) ABSTRACT

A semiconductor memory device of the disclosure comprises a frequency detection circuit that detects the frequency of an input clock signal generated during a measurement time and generates a frequency confirmation data having the information on the frequency of the input clock signal; a status register that receives the frequency confirmation data and generates 1-st to m-th driving control signals; and a 1-st to an m-th operating circuit. In the semiconductor memory device of the disclosure, the operating state can be changed by detecting a frequency change of an input clock signal without an external mode register setting command. As a result, according to the semiconductor memory device of the disclosure, the time required to change the operating mode is reduced.

18 Claims, 13 Drawing Sheets

SEMICONDUCTOR MEMORY DEVICE FOR DETERMINING OPERATION STATE WITH DETECTING FREQUENCY OF INPUT CLOCK SIGNAL

CROSS-REFERENCE TO RELATED APPLICATION

This application claims priority to and the benefit of Korean Patent Application No. 10-2022-0108065 under 35 U.S.C. § 119, filed in the Korean Intellectual Property Office (KIPO) on Aug. 29, 2022, the disclosure of which is incorporated herein by reference in its entirety.

BACKGROUND

1. Technical Field

The disclosure relates to a semiconductor memory device, and more specifically, to a semiconductor memory device for determining operation state with detecting frequency of input clock signal.

2. Discussion of Related Art

In general, a semiconductor memory device such as a synchronous DRAM operates in synchronization with an input clock signal and has operating modes. The semiconductor memory device may be driven in an operation mode corresponding to the frequency of the input clock signal. Therefore, in a semiconductor memory device, in case that the frequency of an input clock signal is changed, it is required that the operation mode be also changed.

One of the methods of changing the operation mode of the semiconductor memory device is to use a mode register. That is, after various operation modes are programmed in the mode register, the operation mode is selected by the mode selection signal. Then, the semiconductor memory device is operated in the selected operation mode.

However, in the conventional semiconductor memory device, in order to change the operating mode by changing the frequency of an input clock signal, a mode register setting command is received from the outside to change the operating state, and then a mode selection signal must be provided through an address pin or a data pin. Accordingly, in the conventional semiconductor memory device, there is a problem that it takes a long time to change an operation mode.

SUMMARY

The disclosure relates to a semiconductor memory device whose operating state can be changed without an external mode register setting command.

The technical objectives to be achieved by the disclosure are not limited to those described herein, and other technical objectives that are not mentioned herein would be clearly understood by a person skilled in the art from the description of the disclosure.

According to an aspect of the disclosure, there is provided a semiconductor memory device.

The semiconductor memory device according to an aspect of the disclosure comprises a frequency detection circuit that detects a frequency of an input clock signal generated during a measurement time and generates a frequency confirmation data having information on the frequency of the input clock signal, wherein a data value of the frequency confirmation data is associated with a logic state of a corresponding one of 1-st to n-th confirmation counting signals, and the frequency of the input clock signal is divided into 1-st to m-th frequency range which do not overlap each other and are increased; a status register that receives the frequency confirmation data and generates 1-st to m-th driving control signals, wherein the k-th driving control signal is activated in case that the frequency of the input clock signal is in the k-th frequency range; and 1-st to m-th operating circuits, wherein a k-th operation circuit drives the semiconductor memory device in an operating state in response to activation of the k-th driving control signal. Here, 'n' is a natural number greater than or equal to '2', 'm' is a natural number greater than or equal to '2', and 'k' is a natural number from '1' to 'm'.

The frequency detection circuit may include a measurement enable generating part that generates a measurement enable signal, wherein the measurement enable signal may be activated during the measurement time; and a frequency counting part that receives the input clock signal and the measurement enable signal, and generates the frequency confirmation data, wherein the frequency confirmation data may include information on a number of clocks of the input clock signal generated during activation of the measurement enable signal.

The measurement enable generating part may include a fixing delay part that generates a fixing delay signal by delaying a signal input to the fixing delay part with a fixing delay time, wherein a phase of the signal input to the fixing delay part may be associated with a phase of an oscillation signal; and an enable inversion part that generates the oscillation signal by inverting the fixing delay signal, and a phase of the measurement enable signal may be associated with the phase of the oscillation signal.

The enable inversion part may be enabled in response to activation of a start signal.

The measurement enable generating part may further include a fixing switch that provides the oscillation signal as the signal input to the fixing delay part in response to activation of a fixing switching signal; a selection delay part that generates a selection delay signal by delaying the signal input to the selection delay part with a selection delay time, wherein the phase of the signal input to the selection delay part may be associated with the phase of the oscillation signal; and a selection switch that provides the oscillation signal as the signal input to the selection delay part in response to activation of a selection switching signal.

The selection switching signal may be an inverted signal of the fixing switching signal.

The frequency counting part may include 1-st to n-th frequency counters that are enabled in response to activation of the measurement enable signal, and driven to generate 1-st to n-th preliminary counting signals, wherein the 1-st preliminary counting signal may transition according to a progress of one period of the input clock signal, and an i-th preliminary counting signal may transition according to a progress of one period of an (i−1)-th preliminary counting signal, and the n-th preliminary counting signal may transition according to a progress of one period of an (n−1)-th preliminary counting signal; and 1-st to n-th counting latch parts that generates the 1-st to n-th confirmation counting signals, wherein a logic state of the j-th confirmation counting signal may be associated with a logic state of the j-th preliminary counting signal, and may be latched in response to inactivation of the measurement enable signal, 'i' may be a natural number from '2' to (n−1), and 'j' may be a natural number from '1' to 'n'.

The 1-st frequency counting part may include a 1-st activation switch that transmits an inverted signal of a 1-st preliminary response signal in response to activation of the input clock signal; a 1-st activation inverting part that is enabled in response to activation of the measurement enable signal, and is driven to invert and output a signal transmitted from the 1-st activation switch; a 1-st inactivation switch that transmits a signal output from the 1-st activation inverting part in response to inactivation of the input clock signal; and a 1-st inactivation inverting part that is driven to output the 1-st preliminary response signal with inverting the signal transmitted by the 1-st deactivation switch. A logic state of the 1-st preliminary counting signal may be associated with a logic state of the 1-st preliminary response signal.

The i-th frequency counting part may include an i-th activation switch that transmits the inverted signal of an i-th preliminary response signal in response to activation of the i-th preliminary counting signal; an i-th activation inverting part that is enabled in response to activation of the measurement enable signal, and is driven to invert and output a signal transmitted from the i-th activation switch; an i-th inactivation switch that transmits a signal output from the i-th activation inverting part in response to inactivation of the (i−1)-th preliminary counting signal; and an i-th inactivation inverting part that is driven to output the i-th preliminary response signal with inverting the signal transmitted by the i-th deactivation switch. A logic state of the i-th preliminary counting signal may be associated with a logic state of the i-th preliminary response signal.

The n-th frequency counting part may include an n-th activation switch that transmits the inverted signal of an n-th preliminary response signal in response to activation of the (n−1)-th preliminary counting signal; an n-th activation inverting part that is enabled in response to the activation of the measurement enable signal, and is driven to invert and output a signal transmitted from the n-th activation switch; an n-th inactivation switch that transmits a signal output from the n-th activation inverting part in response to inactivation of the (n−1)-th preliminary counting signal; and an n-th inactivation inverting part that is driven to output the n-th preliminary response signal with inverting the signal transmitted by the n-th deactivation switch. A logic state of the n-th preliminary counting signal may be associated with a logic state of the n-th preliminary response signal.

The n-th frequency counting part may further include a one-way latching part that is driven to generate the n-th preliminary counting signal with receiving the n-th preliminary response signal, and the logic state of the n-th preliminary counting signal may be latched according to the activation of the n-th preliminary response signal.

The one-way latching part may include a 1-st NOR gate that is driven to perform NOR operation of the n-th preliminary response signal and a preliminary latch signal; a 2-nd NOR gate that is driven to generate the preliminary latch signal with inverting the output signal of the 1-st NOR gate in case that the measurement enable signal is activated; and an inverter that is driven to generate the i-th preliminary counting signal with inverting the output signal of the 1-st NOR gate.

A j-th counting latch part may include a j-th latch switch that is driven to transmit the j-th preliminary counting signal, and turned off in response to inactivation of the measurement enable signal; and a j-th confirmation latch part that is driven to generate the j-th confirmation counting signal with latching the signal transmitted by the j-th latch switch.

The status register may include a reference data storing part that stores 1-st to (m−1)-th reference data, wherein data values of the 1-st to (m−1)-th reference data may be sequentially increased, and each of the 1-st to (m−1)-th reference data may include 1-st to n-th reference bit signals, respectively; a data comparing part that includes 1-st to (m−1)-th comparison decision parts which generate 1-st to (m−1)-th comparison decision signal, wherein the t-th comparison decision signal may be activated as the data value of the frequency confirmation data is higher than the data value of the t-th reference data; and a drive generating part that generates the 1-st to m-th driving control signals with using the 1-st to (m−1)-th comparison decision signals. Here, 't' may be a natural number from '1' to '(m−1)'.

The t-th comparison decision part of the data comparing part may include 1-st to n-th comparison determining parts that generate 1-st to n-th comparison switching signals, wherein the n-th comparison switching signal may be activated in case that a logical state of the n-th confirmation counting signal of the frequency confirmation data and a logical state of the n-th reference bit signal of the t-th reference data are different, and an r-th comparison switching signal is activated, in case that an (r+1)-th to an n-th comparison switching signal are deactivated, and a logic state of an r-th confirmation counting signal of the frequency confirmation data is different from a logic state of the r-th reference bit signal of the t-th reference data; and 1-st to n-th comparison switching parts, wherein a j-th comparison switching part may provide a j-th confirmation counting signal of the frequency confirmation data as the t-th comparison decision signal in response to activation of the j-th comparison switching signal. Here, 'r' may be a natural number from '1' to '(n−1)', and T may be a natural number from '1' to 'n'.

A t-th comparison decision part of the data comparing part may further include a comparison latch part that latches a logic state of the t-th comparison decision signal.

The drive generating part may include an end generation part that generates an end pulse signal, wherein the end pulse signal may be activated as a pulse in response to inactivation of a measurement enable signal; 1-st to m-th driving preliminary parts that generate 1-st to m-th driving preliminary signals, wherein the 1-st driving preliminary signal may be activated according to inactivation of the 1-st comparison decision signal, and an s-th driving preliminary signal may be activated in case that an (s−1)-th comparison decision signal is activated and an s-th comparison decision signal is inactivated, and the m-th driving preliminary signal may be activated according to activation of an (m−1)-th comparison decision signal; and 1-st to m-th driving latch parts that provide the 1-st to m-th driving control signals. Logic states of the 1-st to m-th driving control signals may be associated with a logic state of 1-st to m-th driving preliminary signals, respectively, and may be latched in response to activation of the end pulse signal, and 's' may be a natural number from '2' to (m−1).

A method for determining operation state of a semiconductor memory device according to an aspect of the disclosure, comprises detecting, by a frequency detection circuit, a frequency of an input clock signal generated during a measurement time and generating a frequency confirmation data having information on the frequency of the input clock signal, wherein a data value of the frequency confirmation data is associated with a logic state of a corresponding one of 1-st to n-th confirmation counting signals, and the frequency of the input clock signal is divided into 1-st to m-th frequency ranges which do not overlap each other and are increased; receiving, by a status register, the frequency confirmation data and generating 1-st to m-th driving control signals, wherein the k-th driving control signal is activated in case that the frequency of the input clock signal is in the k-th frequency range; and driving, by a k-th operation circuit, the semiconductor memory device in an operating state in response to activation of the k-th driving control signal. Here, 'n' is a natural number greater than or equal to '2', 'm' is a natural number greater than or equal to '2', and 'k' is a natural number from '1' to 'm'.

The frequency detection circuit may include a measurement enable generating part that generates a measurement enable signal, wherein the measurement enable signal may be activated during the measurement time; and a frequency counting part that receives the input clock signal and the measurement enable signal, and generates the frequency confirmation data, wherein the frequency confirmation data may include information on a number of clocks of the input clock signal generated during activation of the measurement enable signal.

The measurement enable generating part may include a fixing delay part that generates a fixing delay signal by delaying a signal input to the fixing delay part with a fixing delay time, wherein a phase of the signal input to the fixing delay part may be associated with a phase of an oscillation signal; and an enable inversion part that generates the oscillation signal by inverting the fixing delay signal, and a phase of the measurement enable signal may be associated with the phase of the oscillation signal.

In the semiconductor memory device of the disclosure having the above configuration, the operating state of the semiconductor memory device may be changed by detecting the frequency of the input clock signal. For example, in the semiconductor memory device of the disclosure, the operating state can be changed by detecting a frequency change of an input clock signal without an external mode register setting command. As a result, according to the semiconductor memory device of the disclosure, the time required to change the operating mode may be reduced.

BRIEF DESCRIPTION OF THE DRAWINGS

The above and other objects, features and advantages of the disclosure will become more apparent to those skilled in the art by describing in detail embodiments thereof with reference to the accompanying drawings, in which.

DETAILED DESCRIPTION OF THE EMBODIMENTS

Figure 1:
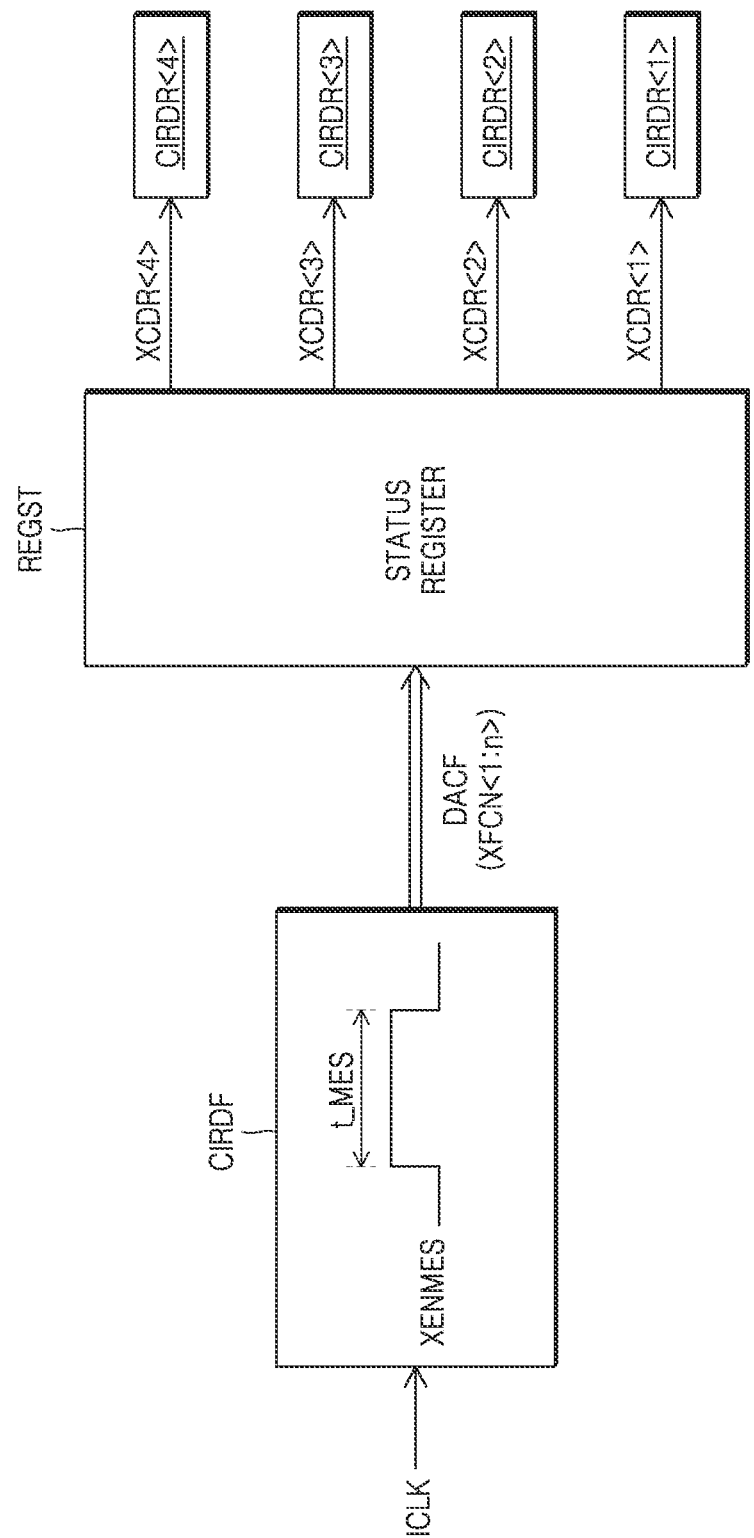
FIG. 1 is a schematic drawing illustrating a semiconductor memory device according to an embodiment of the disclosure.

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these following embodiments.

The terminology used herein is for the purpose of describing embodiments only and is not intended to be limiting of the disclosure. As used herein, the singular forms, such as "a" and "an," are intended to include the plural forms as well, unless the context clearly indicates otherwise. It will be further understood that the terms "comprise," "include," "have," and/or their variants when used in this specification, specify the presence of stated features, regions, integers, steps, operations, elements, and/or components, but do not preclude the presence or addition of one or more other features, regions, integers, steps, operations, elements, components, and/or groups thereof.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection, with or without intervening elements.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, an embodiment of the disclosure will be described in detail with reference to the accompanying drawings.

FIG. 1 is a schematic drawing illustrating a semiconductor memory device according to an embodiment of the disclosure. Referring to FIG. 1, the semiconductor memory device of the embodiment may comprise a frequency detection circuit CIRDF, a status register REGST, and 'm' operation circuits CIRDRs.

Here, 'm' may be a natural number greater than or equal to 2, and may be '4' in this embodiment. For example, the semiconductor memory device of this embodiment may include 1-st to 4-th operation circuits CIRDR<1:4>.

The frequency detection circuit CIRDF may generate a frequency confirmation data DACF with detecting the frequency of an input clock signal ICLK generated during a measurement time t_MES. In the frequency confirmation data DACF, the information on the frequency of the input clock signal ICLK may be included. The measurement time t_MES may correspond to the "H" activation period of the measurement enable signal XENMES.

The data value of the frequency confirmation data DACF may depend on (or be associated with) the logic state of 1-st to n-th confirmation counting signals XFCN<1:n>. Here, 'n' may be a natural number greater than or equal to '2'.

Figure 13:
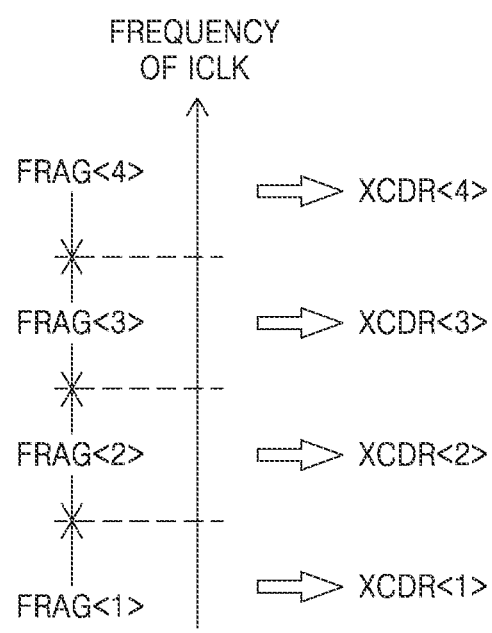
FIG. 13 is a schematic drawing illustrating activation of the driving control signal corresponding to a frequency range of an input clock signal applied to the semiconductor memory device of FIG. 1 according to an embodiment.

The frequency of the input clock signal ICLK may be divided into 1-st to 4-th frequency ranges FRAG<1:4>, as shown in FIG. 13. The 1-st to the 4-th frequency ranges FRAG<1:4> may not overlap each other. In this embodiment, the 1-st to the 4-th frequency ranges FRAG<1:4> may be sequentially increased.

Figure 2:
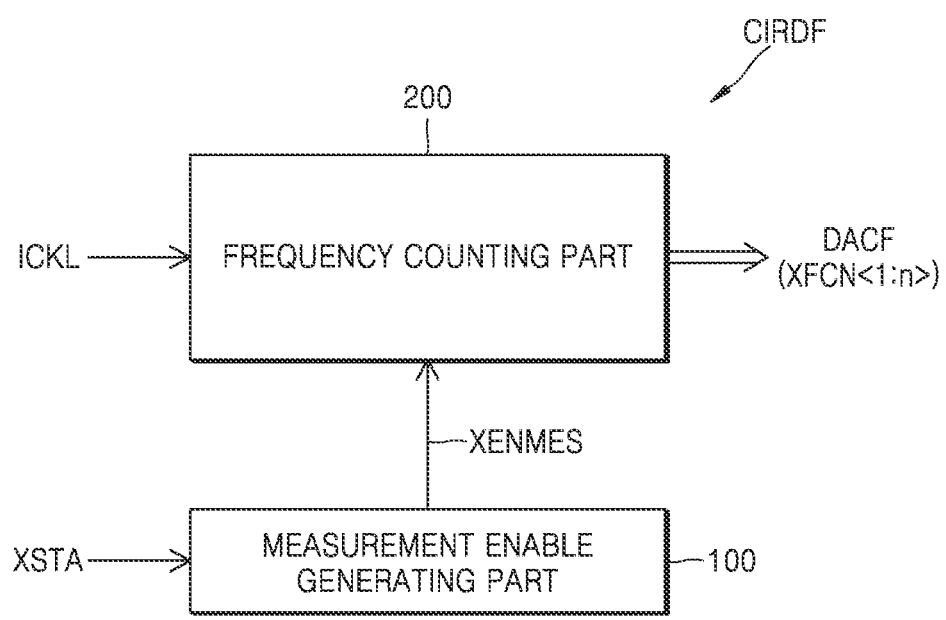
FIG. 2 is a schematic drawing illustrating the frequency detection circuit of FIG. 1 according to an embodiment.

FIG. 2 is a schematic drawing illustrating the frequency detection circuit CIRDF of FIG. 1 according to an embodiment. Referring to FIG. 2, the frequency detection circuit CIRDF may include a measurement enable generating part 100 and a frequency counting part 200.

The measurement enable generating part 100 may generate a measurement enable signal XENMES. The measurement enable signal XENMES may be activated as "H" during the measurement time t_MES.

Figure 3:
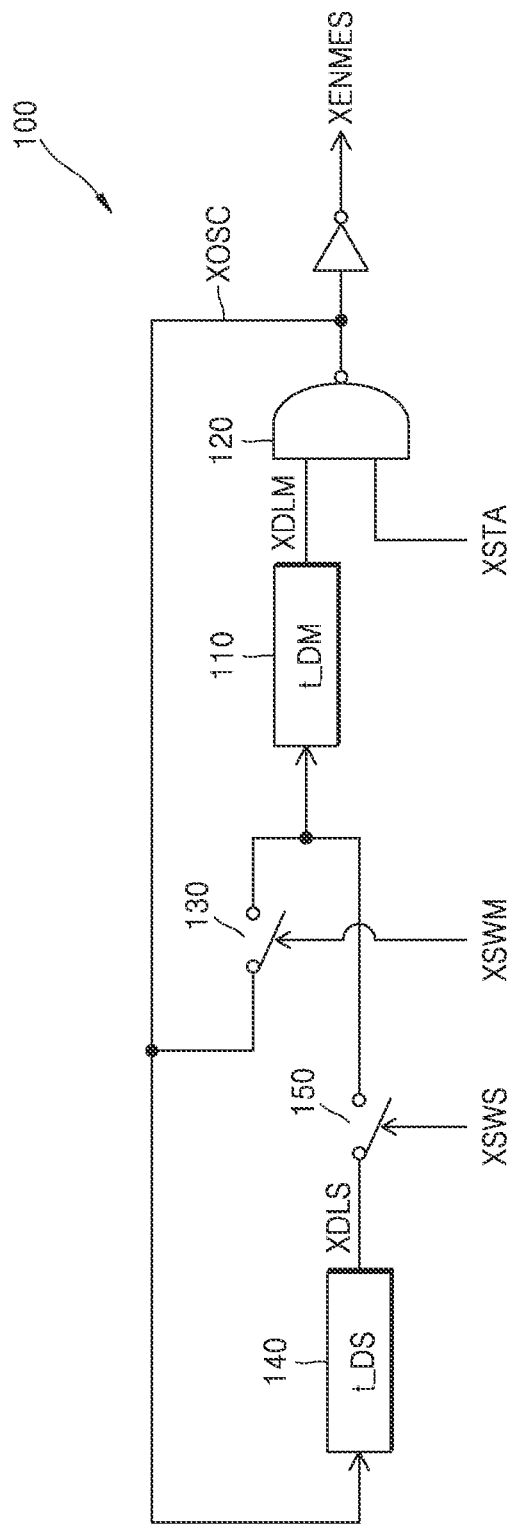
FIG. 3 is a schematic drawing illustrating the measurement enable generating part of FIG. 2 according to an embodiment.

FIG. 3 is a schematic drawing illustrating the measurement enable generating part 100 of FIG. 2 according to an embodiment. Referring to FIG. 3, the measurement enable generating part 100 may include a fixed delay part 110 and an enable inversion part 120, and may further include a fixed switch 130, a selection delay part 140 and a selection switch 150.

The fixed delay part 110 may delay a signal input thereto by a fixed delay time t_DM and generate a fixed delay signal XDLM. The phase of the signal input to the fixed delay part 110 may depend on (or be associated with) the phase of an oscillation signal XOSC.

The enable inversion part 120 may generate the oscillation signal XOSC by inverting the fixing delay signal XDLM. The phase of the measurement enable signal XENMES may depend on (or be associated with) the phase of the oscillation signal XOSC.

The enable inversion part 120 may be enabled in response to activation of "H" of a start signal XSTA.

The fixing switch 130 may provide the oscillation signal XOSC as the signal input to the fixing delay part 110 in response to activation of "H" of a fixing switching signal XSWM.

The selection delay part 140 may generate a selection delay signal XDLS by delaying the signal input to the selection delay part 140 with a selection delay time t_DS. The phase of the signal input to the selection delay part 140 may depend on (or be associated with) the phase of the oscillation signal XOSC.

The selection switch 150 may provide the oscillation signal XOSC as the signal input to the selection delay part 140 in response to activation of "H" of a selection switching signal XSWS.

The selection switching signal XSWS may be an inverted signal of the fixing switching signal XSWM.

In the measurement enable generation part 100 as described above, the period of the measurement enable signal XENMES may be adjusted according to whether the fixing switching signal XSWM and the selection switching signal XSWS are activated.

In other words, the length of the measurement time t_MES, which corresponds to the activation period of the measurement enable signal XENMES, can be adjusted.

Specifically, in case that the fixing switching signal XSWM is activated, the oscillation signal XOSC may act as the signal input to the fixed delay part 110. In this case, the measurement time t_MES may correspond to the fixing delay time t_DM.

Also, in case that the selection switching signal XSWS is activated, the selection delay signal XDLS may act as the signal input to the fixing delay part 110. In this case, the measurement time t_MES may correspond to the sum of the fixing delay time t_DM and the selection delay time t_DS.

Referring again to FIG. 2, the frequency counting part 200 may receive the input clock signal ICLK and the measurement enable signal XENMES, and generate the frequency confirmation data DACF.

Figure 4:
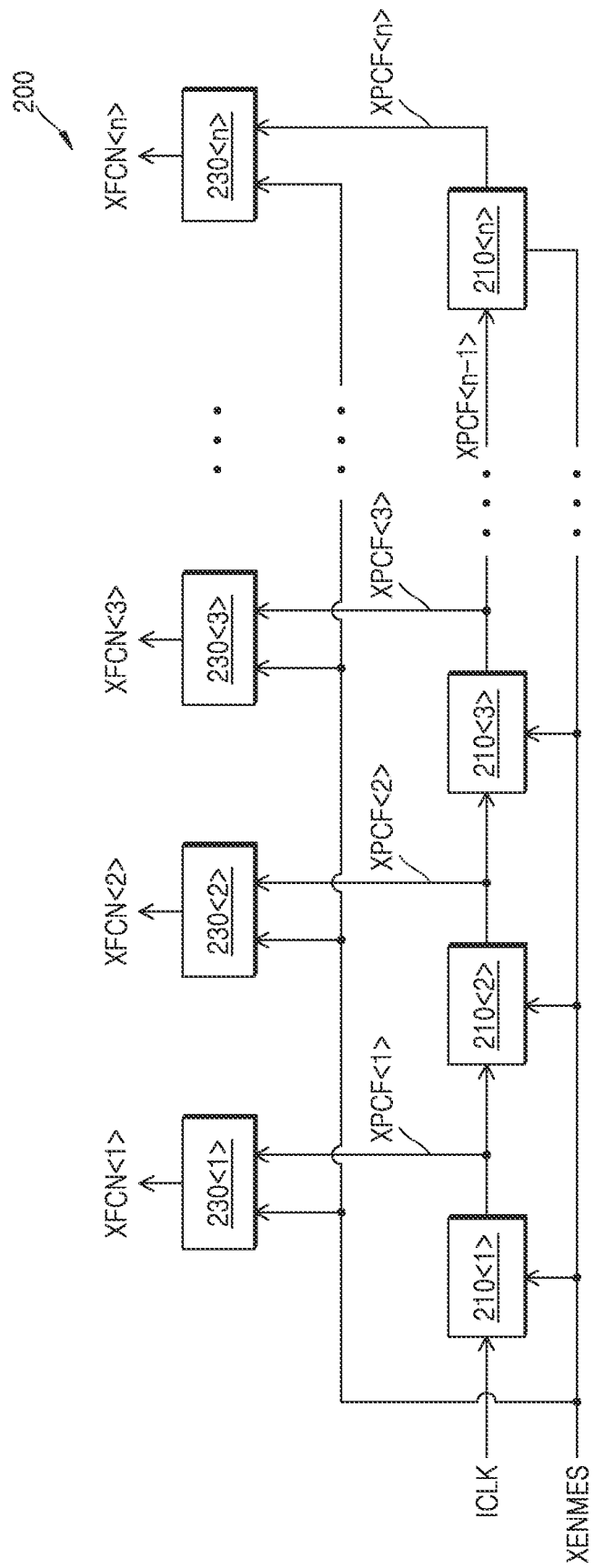
FIG. 4 is a schematic drawing illustrating the frequency counting part of FIG. 2 according to an embodiment.

FIG. 4 is a schematic drawing illustrating the frequency counting part 200 of FIG. 2 according to an embodiment. Referring to FIG. 4, the frequency counting part 200 may include 1-st to n-th frequency counters 210<1:n> and 1-st to n-th counting latch parts 230<1:n>.

The 1-st to n-th frequency counters 210<1:n> may be enabled in response to activation of "H" of the measurement enable signal XENMES. The 1-st to n-th frequency counters 210<1:n> may be driven to generate 1-st to n-th preliminary counting signals XPCF<1:n>.

Figure 5:
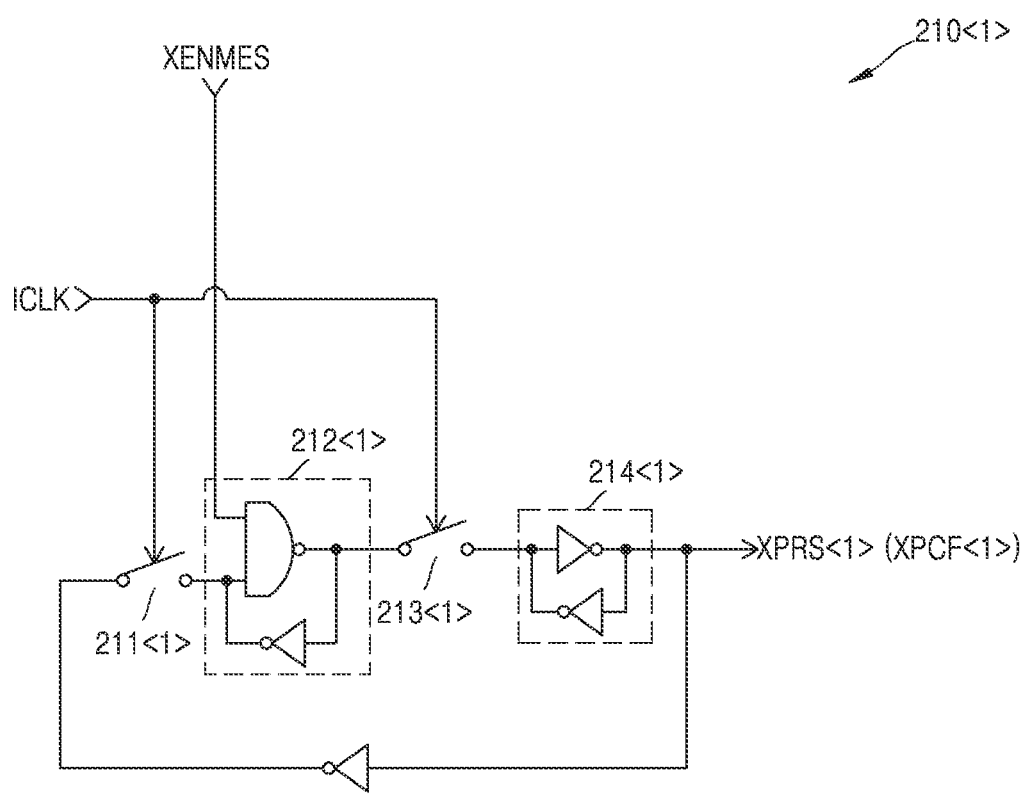
FIG. 5 is a schematic drawing illustrating the 1-st frequency counter of FIG. 4 according to an embodiment.

FIG. 5 is a schematic drawing illustrating the 1-st frequency counter 210<1> of FIG. 4 according to an embodiment. Referring to FIG. 5, the 1-st frequency counter 210<1> may include a 1-st activation switch 211<1>, a 1-st activation inverting part 212<1>, a 1-st inactivation switch 213<1> and a 1-st inactivation inverting part 214<1>.

The 1-st activation switch 211<1> may be driven to transmit the inverted signal of a 1-st preliminary response signal XPRS<1> to the 1-st activation inverting part 212<1> in response to the activation of "H" of the input clock signal ICLK.

The 1-st activation inverting part 212<1> may be enabled in response to the activation of "H" of the measurement enable signal XENMES. The 1-st activation inverting part 212<1> may be driven to invert and output the signal which is transmitted from the 1-st activation switch 211<1>.

The 1-st inactivation switch 213<1> may be driven to transmit the signal, which is output from the 1-st activation inverting part 212<1>, to the 1-st inactivation inverting part 214<1> in response to inactivation of "L" of the input clock signal ICLK.

The 1-st inactivation inverting part 214<1> may be driven to output the 1-st preliminary response signal XPRS<1> with inverting the signal transmitted by the 1-st deactivation switch 213<1>.

The logic state of the 1-st preliminary counting signal XPCF<1> may depend on (or be associated with) the logic state of the 1-st preliminary response signal XPRS<1>. In an embodiment, the logic state of the 1-st preliminary counting signal XPCF<1> may be the same as that of the 1-st preliminary response signal XPRS<1>.

According to the 1-st frequency counter 210<1> configured as described above, the 1-st preliminary response signal XPRS<1> may transition according to the progress of one period of the input clock signal ICLK.

Figure 6:
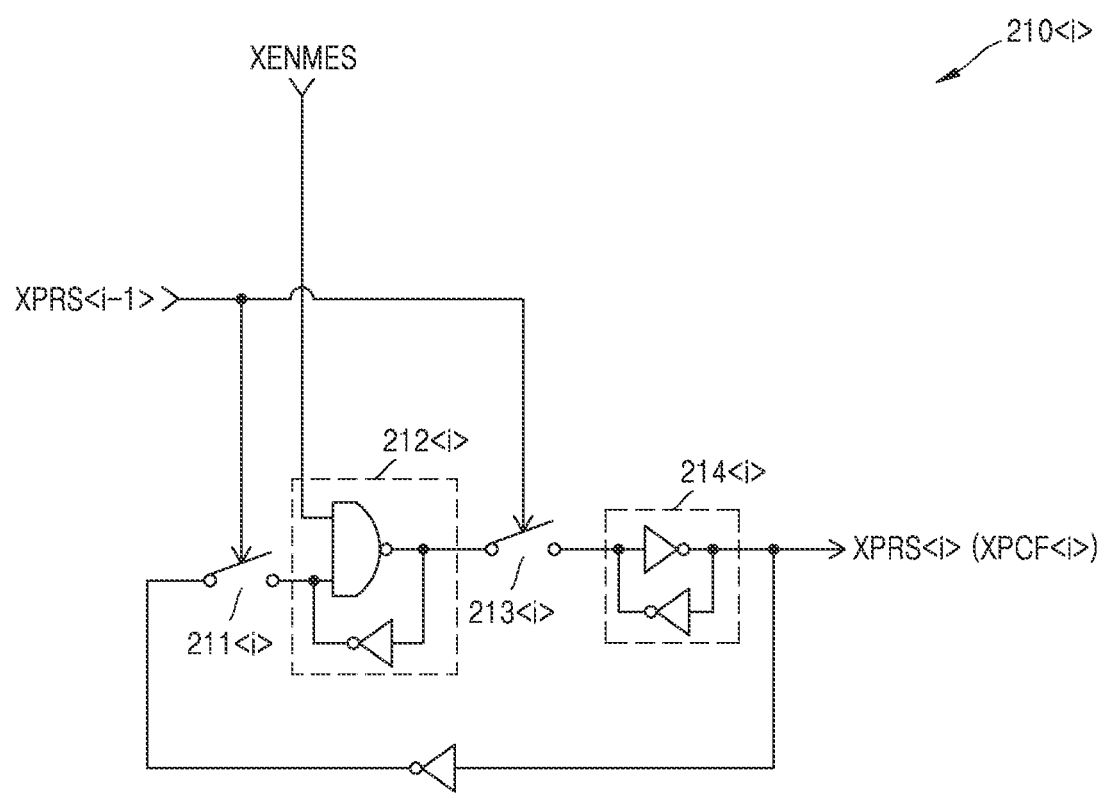
FIG. 6 is a schematic drawing illustrating one of 2-nd to (n−1)-th frequency counter of FIG. 4 according to an embodiment.

FIG. 6 is a schematic drawing illustrating an i-th frequency counter 210<i> of FIG. 4 according to an embodiment. Here, T may be natural number from '2' to '(n−1)'. Referring to FIG. 6, the i-th frequency counter 210<i> may include an i-th activation switch 211<i>, an i-th activation inverting part 212<i>, an i-th inactivation switch 213<i> and an i-th inactivation inverting part 214<i>.

The i-th activation switch 211<i> may be driven to transmit the inverted signal of an i-th preliminary response signal XPRS<i> to the i-th activation inverting part 212<i> in response to the activation of "H" of an (n−1)-th preliminary counting signal XPCF<i−1>.

The i-th activation inverting part 212<i> may be enabled in response to the activation of "H" of the measurement enable signal XENMES. The i-th activation inverting part 212<i> may be driven to invert and output the signal which is transmitted from the i-th activation switch 211<i>.

The i-th inactivation switch 213<i> may be driven to transmit the signal, which is output from the i-th activation inverting part 212<i>, to the i-th inactivation inverting part 214<i> in response to inactivation of "L" of the i-th preliminary counting signal XPCF<i−1>.

The i-th inactivation inverting part 214<i> may be driven to output the i-th preliminary response signal XPRS<i> with inverting the signal transmitted by the i-th deactivation switch 213<i>.

The logic state of the i-th preliminary counting signal XPCF<i> may depend on (or be associated with) the logic state of the i-th preliminary response signal XPRS<i>. In an embodiment, the logic state of the i-th preliminary counting signal XPCF<i> may be the same as that of the i-th preliminary response signal XPRS<i>.

According to the i-th frequency counter 210<i> configured as described above, the i-th preliminary response signal XPRS<i> may transition according to the progress of one period of an (i−1)-th preliminary counting signal XPRS<i−1>.

Figure 7:
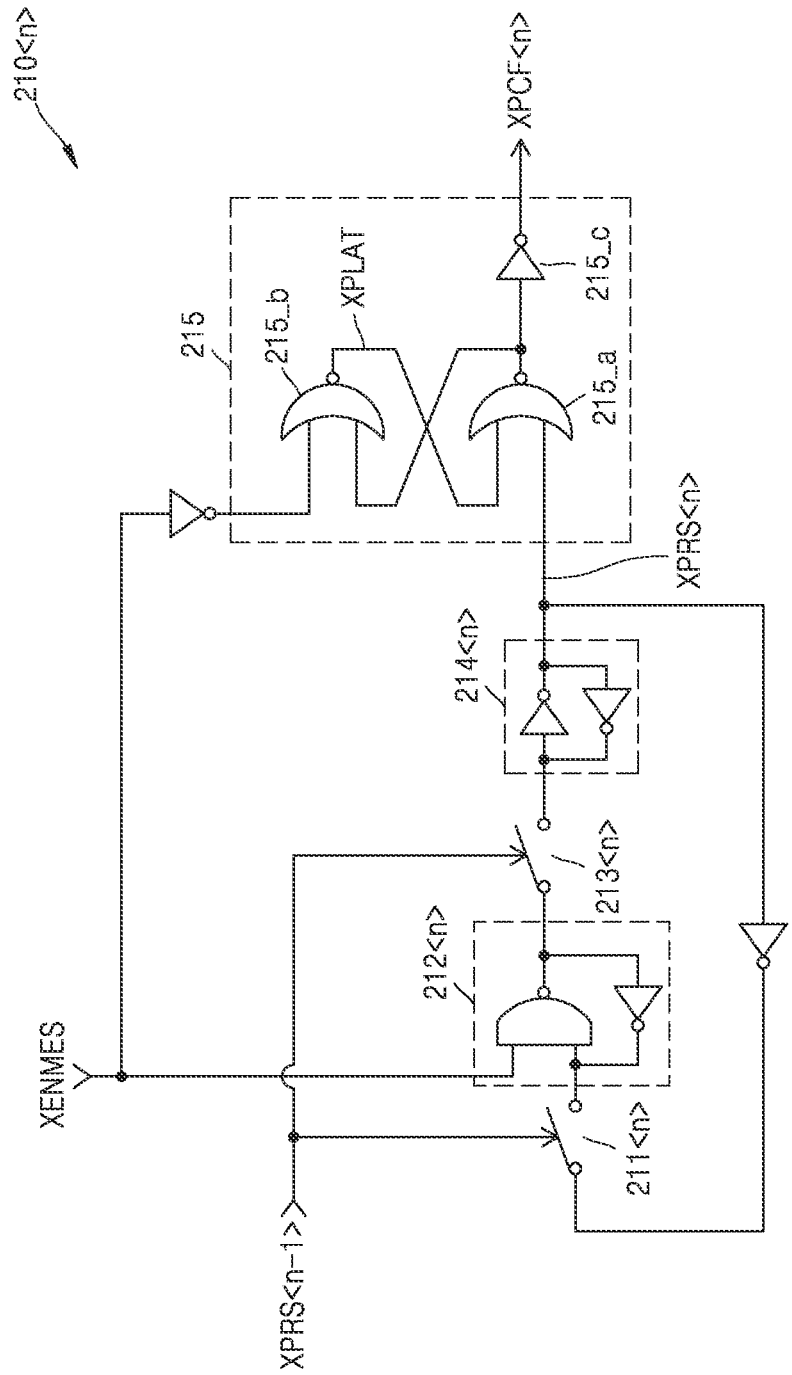
FIG. 7 is a schematic drawing illustrating the n-th frequency counter of FIG. 4 according to an embodiment.

FIG. 7 is a schematic drawing illustrating the n-th frequency counter 210<n> of FIG. 4 according to an embodiment. Referring to FIG. 7, the n-th frequency counter 210<n> may include an n-th activation switch 211<n>, an n-th activation inverting part 212<n>, an n-th inactivation switch 213<n> and an n-th inactivation inverting part 214<n>.

The n-th activation switch 211<n> may be driven to transmit the inverted signal of an n-th preliminary response signal XPRS<n> to the n-th activation inverting part 212<n> in response to the activation of "H" of an (n−1)-th preliminary counting signal XPCF<n−1>.

The n-th activation inverting part 212<n> may be enabled in response to the activation of "H" of the measurement enable signal XENMES. The n-th activation inverting part 212<n> may be driven to invert and output the signal which is transmitted from the n-th activation switch 211<n>.

The n-th inactivation switch 213<n> may be driven to transmit the signal, which is output from the n-th activation inverting part 212<n>, to the n-th inactivation inverting part 214<n> in response to inactivation of "L" of the n-th preliminary counting signal XPCF<n−1>.

The n-th inactivation inverting part 214<n> may be driven to output the n-th preliminary response signal XPRS<n> with inverting the signal transmitted by the n-th deactivation switch 213<n>. The logic state of the n-th preliminary counting signal XPCF<n> may depend on (or be associated with) the logic state of the n-th preliminary response signal XPRS<n>.

According to the n-th frequency counter 210<n> configured as described above, the n-th preliminary response signal XPRS<n> may transition according to the progress of one period of an (n−1)-th preliminary counting signal XPRS<n−1>.

The n-th frequency counter 210<n> may further include a one-way latching part 215.

The one-way latching part 215 may be driven to generate the n-th preliminary counting signal XPCF<n> with receiving the n-th preliminary response signal XPRS<n>.

The one-way latching part 215 may include a 1-st NOR gate 215_$a$, a 2-nd NOR gate and an inverter 215_$c$.

The 1-st NOR gate 215_$a$ may be driven to perform NOR operation of the n-th preliminary response signal XPRS<n> and a preliminary latch signal XPLAT.

The 2-nd NOR gate 215_$b$ may be driven to generate the preliminary latch signal XPLAT with inverting the output signal of the 1-st NOR gate 215_$a$ in case that the measurement enable signal XENMES is activated.

The inverter 215_$c$ may be driven to generate the i-th preliminary counting signal XPCF with inverting the output signal of the 1-st NOR gate 215_$a$.

According to the one-way latching part 215 configured as described above, the logic state of the n-th preliminary counting signal XPCF<n> may be latched according to the activation of "H" of the n-th preliminary response signal XPRS<n>.

Figure 8:
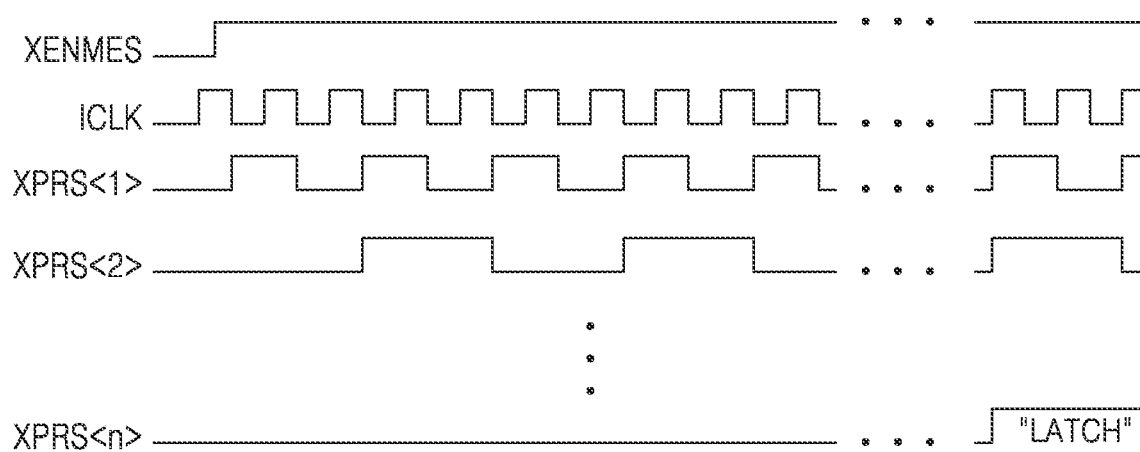
FIG. 8 is a schematic timing diagram for explaining operations of 1-st to n-th preliminary counting signals generated from the 1-st to n-th frequency counter of FIG. 4 according to an embodiment.

FIG. 8 is a schematic timing diagram illustrating operations of 1-st to n-th preliminary counting signals XPCF<1:n> generated from the 1-st to n-th frequency counters 210<1:n> of FIG. 4 according to an embodiment.

Subsequently, with reference to FIG. 8, operations of the 1-st to the n-th preliminary counting signals XPCF<1:n> will be described.

The 1-st preliminary counting signal XPCF<1> may transition according to the progress of one period of the input clock signal ICLK.

A 2-nd preliminary counting signal XPCF<2> may be transitioned according to the progress of one period of the 1-st preliminary counting signal XPCF<1>. A 3-rd to the (n−1) preliminary counting signals XPCF<3:(n−1)> may also transition in a similar manner to the second preliminary counting signal XPCF<2>. For example, the i-th preliminary counting signal XPCF<i> may transition according to the progress of one period of the (i−1)-th preliminary counting signal XPCF<i−1>.

The n-th preliminary counting signal XPCF<n> may transition according to the progress of one period of the (n−1)-th preliminary counting signal XPCF<n−1>. Here, the n-th preliminary counting signal XPCF<n> may be latched in the "H" activated state in case that it is activated to "H" during the measurement time t_MES.

For example, the n-th preliminary counting signal XPCF<n> may be latched in the "H" activation state. Thus, the transition to "L" in the n-th preliminary counting signal XPCF<n>, which may be generated in case that the frequency of the input clock signal ICLK is high, can be prevented. As a result, malfunction of the semiconductor memory device of the disclosure can be prevented.

Referring again to FIG. 4, the 1-st to n-th counting latch part 230<1:n> may be driven to generate the 1-st to the n-th confirmation counting signal XFCN<1:n>.

Figure 9:
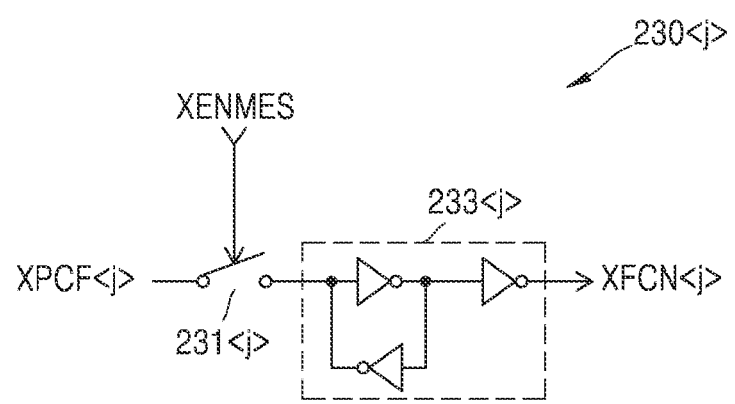
FIG. 9 is a schematic drawing illustrating one of counting latch parts of FIG. 4 according to an embodiment.

FIG. 9 is a schematic drawing illustrating a j-th counting latch part 230<j> of FIG. 4 according to an embodiment. Here, 'j' may be a natural number from '1' to 'n'. Referring to FIG. 9, the j-th counting latch part 230<j> of FIG. 4 may include a j-th latch switch 231<j> and a j-th confirmation latch part 233<j>.

The j-th latch switch 231<j> may be driven to transmit the j-th preliminary counting signal XPCN<j> to the j-th confirmation latch part 233<j>. The j-th latch switch 231<j> may be turned off in response to the inactivation of "L" of the measurement enable signal XENMES.

The j-th confirmation latch part 233<j> may be driven to generate the j-th confirmation counting signal XFCN<j> with latching the signal transmitted by the j-th latch switch 231<j>.

According to the j-th counting latch part 230<j> configured as described above, the logic state of the j-th confirmation counting signal XFCN<j> may depend on (or be associated with) the logic state of the j-th preliminary counting signal XPRS<j>. The logic state of the j-th check counting signal XFCN<j> may be latched at the end of the measurement time t_MES, for example, in response to inactivation of the measurement enable signal XENMES to "L".

As a result, in the frequency confirmation data DACF generated from the frequency counting part 200 as described above, the clock number of the input clock signal ICLK generated while the measurement enable signal XENMES is activated to "H", for example, the information for the frequency of the input clock signal ICLK is included.

The 1-st to n-th confirmation counting signals XFCN<1:n> may correspond to data bits of the frequency check data DACF and have a series order.

In this embodiment, the 1-st confirmation counting signal XFCN<1> may correspond to the least significant data bit of the frequency check data DACF, and the n-th confirmation counting signal XFCN<n> may correspond to the most significant data bit of the frequency check data DACF.

Referring again to FIG. 1, the status register REGST may be driven to receive the frequency confirmation data DACF, and may be driven to generate 1-st to 4-th driving control signals XCDR<1:4>.

Figure 10:
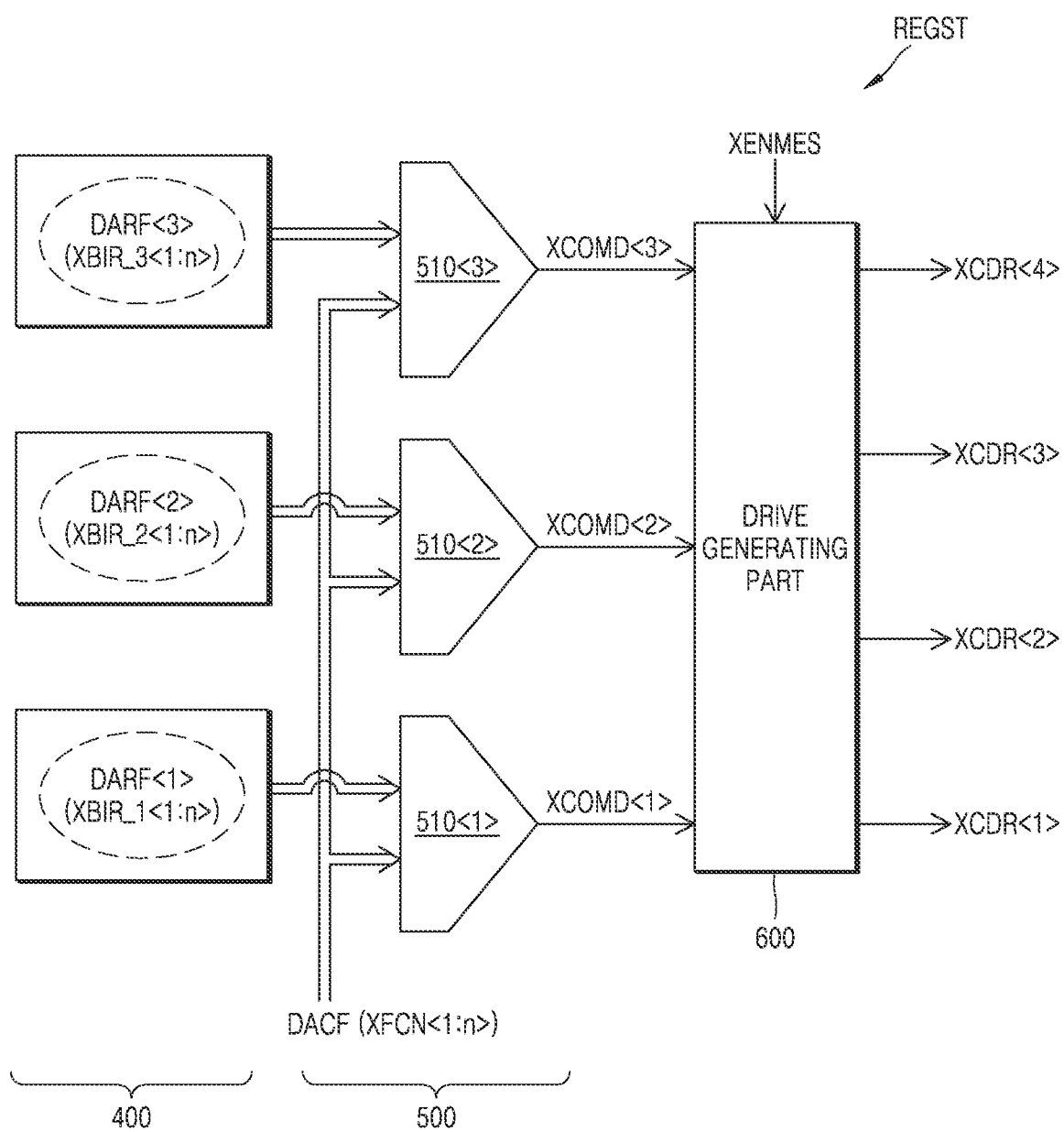
FIG. 10 is a schematic drawing illustrating the status register of FIG. 1 according to an embodiment.

FIG. 10 is a schematic drawing illustrating the status register REGST of FIG. 1 according to an embodiment. Referring to FIG. 10, the status register REGST may include a reference data storing part 400, a data comparing part 500 and a drive generating part 600.

The reference data storing part 400 may store 1-st to 3-rd reference data DARF<1:3>. The data values of the 1-st to 3-rd reference data DARF<1:3> may be sequentially increased. For example, the data value of the 2-nd reference data DARF<2> may be larger than that of the 1-st reference data DARF<1>, and the data value of the 3-rd reference data DARF<3> may be larger than that of the 2-nd reference data DARF<2>.

Each of the 1-st to 3-rd reference data DARF<1:3> may include or consist of the respective 1-st to n-th reference bit signals DARF_1<1:n>, DARF_2<1:n>, DARF_3<1:n>. Here, the respective 1-st to n-th reference bit signals DARF_1<1:n>, DARF_2<1:n>, DARF_3<1:n> may act as data bits for the 1-st to 3-rd reference data DARF<1:3>.

The data value of the 1-st reference data DARF<1> may correspond to the boundary data value of a 1-st frequency range FRAG<1> and a 2-nd frequency range FRAG<2>, and the data value of the 2-nd reference data DARF<2> may correspond to the boundary data value of the 1-2nd frequency range FRAG<2> and a 3-rd frequency range FRAG<3>. The data value of the 3-rd reference data DARF<3> may correspond to the boundary data value of the 3-rd frequency range FRAG<3> and a 4-th frequency range FRAG<4>. See FIG. 13.

The data comparing part 500 may include 1-st to 3-rd comparison decision parts 510<1:3> which generate 1-st to 3-rd comparison decision signals XCOMD<1:3>.

Figure 11:
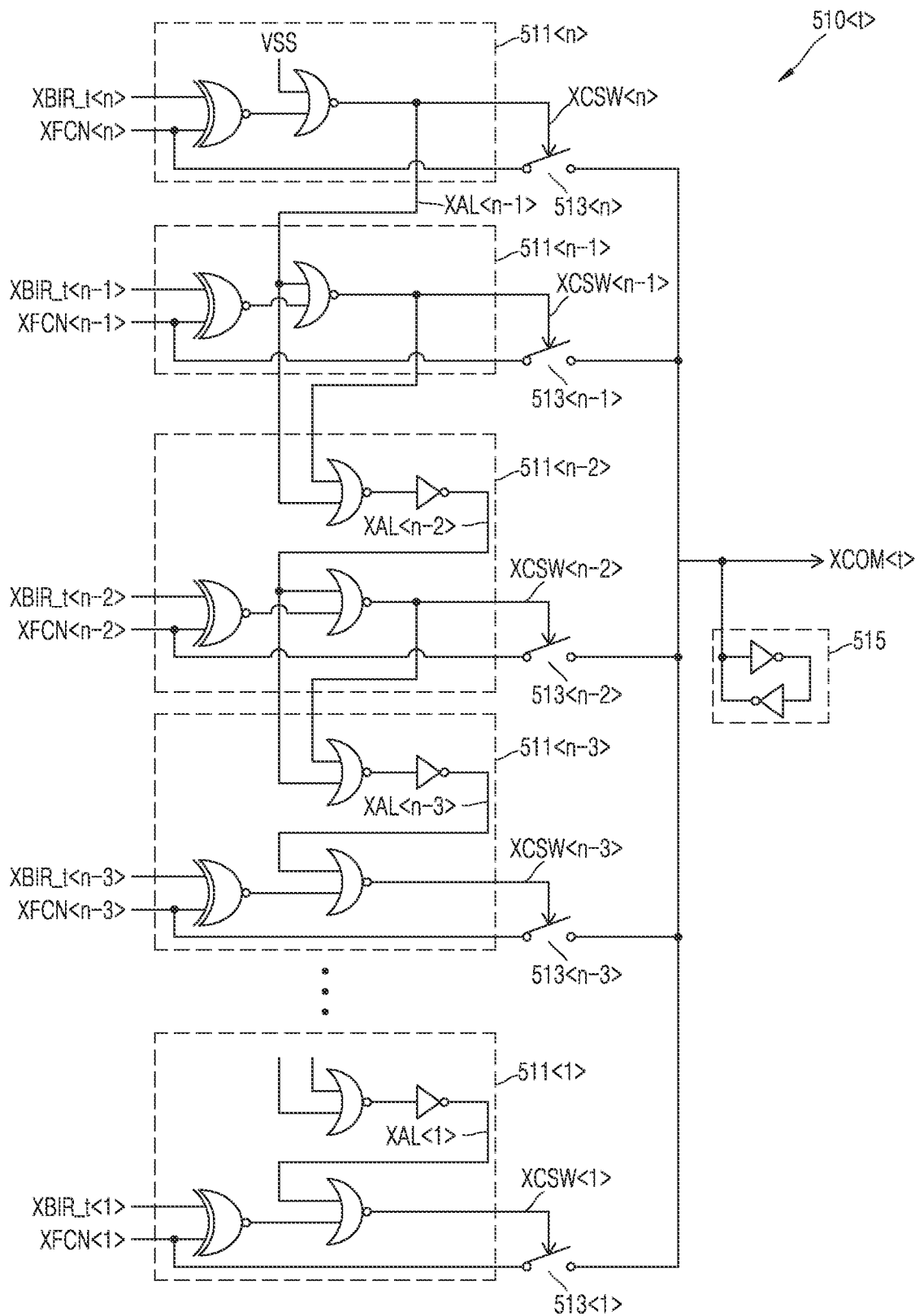
FIG. 11 is a schematic drawing illustrating one of comparison decision parts of FIG. 10 according to an embodiment.

FIG. 11 is a schematic drawing illustrating a t-th comparison decision part 510<t> of FIG. 10 according to an embodiment. Here, 't' may be a natural number from '1' to '3'.

Referring to FIG. 11, the t-th comparison decision part 510<t> may include 1-st to n-th comparison determining parts 511<1:n> and 1-st to n-th comparison switching parts 513<1:n>.

The 1-st to n-th comparison determining parts 511<1:n> may be driven to generate 1-st to n-th comparison switching signals XCSW<1:n>.

For example, the n-th comparison determining part 511<n> may be driven to generate the n-th comparison switching signal XCSW<n> with comparing the logic state of the n-th confirmation counting signal XFCN<n> of the frequency confirmation data DACF and the logic state of the n-th reference bit signal XBIR_t<n> of the t-th reference data DARF<t>.

In case that the logical state of the n-th confirmation counting signal XFCN<n> of the frequency confirmation data DACF and the n-th reference bit signal XBIR_t<n> of the t-th reference data DARF<t> are different, the n-th comparison switching signal XCSW<n> may be activated to "H".

In case that the logical state of the n-th confirmation counting signal XFCN<n> of the frequency confirmation data DACF and the n-th reference bit signal XBIR_t<n> of the t-th reference data DARF<t> are the same, the n-th comparison switching signal XCSW<n> may be inactivated to "L".

A r-th comparison determining part 511<r> may be driven to generate a r-th comparison switching signal XCSW<r> with comparing the logic state of a r-th confirmation counting signal XFCN<r> of the frequency confirmation data DACF and the logic state of a r-th reference bit signal XBIR_t<r> of the t-th reference data DARF<t>, in case that a r-th upper equal signal XAL<r> is inactivated as "L". Here, 'r' may be a natural number from '1' to '(n−1)'.

The r-th upper equal signal XAL<r> may be deactivated as "L", in case that all of the (r+1)-th to the n-th comparison switching signal XCSW<(r+1):n> are inactivated as "L", for example, in case that the logic states of all of the (r+1)-th to the n-th confirmation counting signal XFCN<(r+1):n> of the frequency confirmation data DACF are the same as the logic states of corresponding signals of the (r+1)-th to the n-th reference bit signal XBIR_t<(r+1):n>.

The r-th upper equal signal XAL<r> may be activated as "H", in case that at least one of the (r+1)-th to the n-th comparison switching signal XCSW<(r+1):n> is activated as "H", for example, in case that the logic state of at least one of the (r+1)-th to the n-th confirmation counting signal XFCN<(r+1):n> of the frequency confirmation data DACF is different from the logic state of corresponding signal of the (r+1)-th to the n-th reference bit signal XBIR_t<(r+1):n>.

The r-th comparison switching signal XCSW<r> may be activated to "H", in case that the logic states of all of the (r+1)-th to the n-th confirmation counting signal XFCN<(r+1):n> of the frequency confirmation data DACF are the same as the logic states of corresponding signals of the (r+1)-th to the n-th reference bit signal XBIR_t<(r+1):n>, and the logic state of an r-th confirmation counting signal XFCN<r> of the frequency confirmation data DACF is different from the logic state of the r-th reference bit signal XBIR_t<r> of the t-th reference data DARF<t>.

The r-th comparison switching signal XCSW<r> may be inactivated as "L", in case that the logic state of at least one of the (r+1)-th to the n-th confirmation counting signal XFCN<(r+1):n> of the frequency confirmation data DACF is different from the logic state of corresponding signals of the (r+1)-th to the n-th reference bit signal XBIR_t<(r+1):n>, or in case that the logic state of an r-th confirmation counting signal XFCN<r> of the frequency confirmation data DACF is the same as the logic state of the r-th reference bit signal XBIR_t<r> of the t-th reference data DARF<t>.

The j-th comparison switching part 513<j> may be driven to provide a j-th confirmation counting signal XFCN<j> of the frequency confirmation data DACF as the t-th comparison decision signal XCOM<t> in response to activation of the j-th comparison switching signal XCSW<j>. Here, 'j' may be a natural number from '1' to 'n'.

The t-th comparison decision part 510<t> may further include a comparison latch part 515. The comparison latch part 515 may be driven to latch the logic state of the t-th comparison decision signal XCOM<t>.

In the t-th comparison-determination part 510<t>, the data value of the frequency confirmation data DACF may be compared to the data value of the t-th reference data DARF<t>. The comparison may be performed sequentially from the upper data bit to the lower data bit.

For example, first, the logic state of the n-th confirmation counting signal XFCN<n> of the frequency confirmation data DACF may be compared to the logic state of the n-th reference bit signal XBIR_t<n> of the t-th reference data DARF<t>.

In case that the logic state of the n-th confirmation counting signal XFCN<n> of the frequency confirmation data DACF is different from the logic state of the n-th reference bit signal XBIR_t<n> of the t-th reference data DARF<t>, only the n-th comparison switching signal XCSW<n> may be activated as "H", and the remaining comparison switching signals XSCWs may be inactivated as "L".

In this case, the n-th comparison switching part 513<n> may provide the n-th confirmation counting signal XFCN<n> of the frequency confirmation data DACF as the t-th comparison decision signal XCOM<t>.

In case that the logic state of the n-th confirmation counting signal XFCN<n> of the frequency confirmation data DACF is the same as the logic state of the n-th reference bit signal XBIR_t<n> of the t-th reference data DARF<t>, the n-th comparison switching signal XCSW<n> may be inactivated as "L".

In case that the (n−1)-th comparison switching signal XCSW<n−1> is inactivated as "L", the logic state of the (n−1)-th confirmation counting signal XFCN<n−1> of the frequency confirmation data DACF may be compared to the logic state of the (n−1)-th reference bit signal XBIR_t<n−1> of the t-th reference data DARF<t>.

As a result, the logic state of the t-th comparison decision signal XCOMD<t> may be the same as the logic state of the confirmation counting signal XFCN, which corresponds to the first upper bit of the frequency confirmation data DACF that is different from the corresponding bit signal of the t-th reference data DARF<t>.

For example, the (n−1)-th check counting signal XFCN<n−1> may be the bit signal corresponding to the first upper bit of the frequency confirmation data DACF that is different from the corresponding bit signal of the t-th reference data DARF<t>.

For example, in case that the logical state of the (n−1)-th confirmation counting signal XFCN<n−1> of the frequency check data DACF is "H", and the (n−1)-th reference bit signal XBIR_t<n−1> of the t-th reference data DARF<t> is "L", for example, in case that the data value of the frequency confirmation data DACF is greater than the data value of the t-th reference data DARF<t>, the t-th comparison decision signal XCOMD<t> may be activated to "H".

In case that the logical state of the (n−1)-th confirmation counting signal XFCN<n−1> of the frequency check data DACF is "L", and the (n−1)-th reference bit signal XBIR_t<n−1> of the t-th reference data DARF<t> is "H", for example, in case that the data value of the frequency confirmation data DACF is smaller than the data value of the t-th reference data DARF<t>, the t-th comparison decision signal XCOMD<t> may be inactivated to "L".

As a result, the logic state of the t-th comparison decision signal XCOMD<t>, which is generated from the t-th comparison decision part 510<t> as described above, may represent the magnitude relationship of the data value of the frequency confirmation data DACF and the t-th reference the data DARF<t>.

For example, the logic state of "H" of the t-th comparison decision signal XCOMD<t> may represent that that the data value of the frequency confirmation data DACF is greater than the data value of the t-th reference data DARF<t>.

The logic state of "L" of the t-th comparison decision signal XCOMD<t> may represent that the data value of the frequency confirmation data DACF is smaller than the data value of the t-th reference data DARF<t>.

As for a case in which the data value of the frequency confirmation data DACF is the same as the data value of the t-th reference data DARF<t>, the possibility of actually occurring may be very low, and furthermore, it can be disregarded at the time of design.

Referring again to FIG. 10, the drive generating part 600 may be driven to generate the 1-st to 4-th driving control signals XCDR<1:4> with using the 1-st to 3-rd comparison decision signals XCOMD<1:3>.

Figure 12:
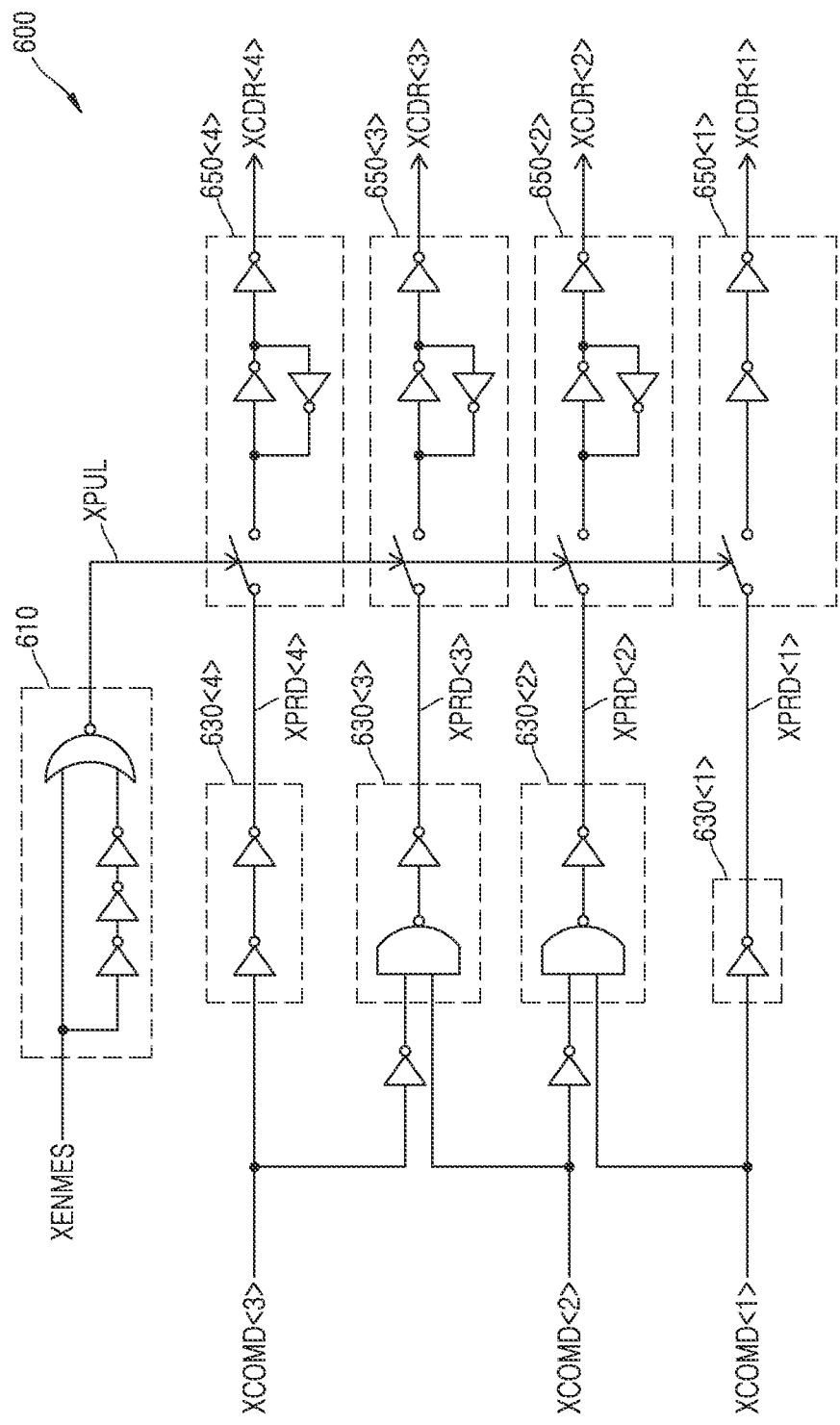
FIG. 12 is a schematic drawing illustrating the drive generating part of FIG. 10 according to an embodiment.

FIG. 12 is a schematic drawing illustrating the drive generating part 600 of FIG. 10 according to an embodiment. Referring to FIG. 12, the drive generating part 600 may include an end generation part 610, 1-st to 4-th driving preliminary parts 630<1:4> and 1-st to 4-th driving latch parts 650<1:4>.

The end generation part 610 may be driven to generate an end pulse signal XPUL. The end pulse signal XPUL may be activated as an "H" pulse at the end of the measurement time t_MES, for example, in response to inactivation of "L" of the measurement enable signal XENMES.

The 1-st to 4-th driving preliminary parts 630<1:4> may be driven to generate 1-st to 4-th driving preliminary signals XPRD<1:4>.

The 1-st driving preliminary signal XPDR<1> may be activated to "H" according to inactivation of "L" of the 1-st comparison decision signal XCOMD<1>. The 2-nd driving preliminary signal XPDR<2> may be activated to "H" in case that the 1-st comparison decision signal XCOMD<1> is activated as "H" and the 2-nd comparison decision signal XCOMD<2> is inactivated as "L". The 3-rd driving preliminary signal XPDR<3> may be activated to "H" in case that the 2-nd comparison decision signal XCOMD<2> is activated as "H" and the 3-rd comparison decision signal XCOMD<3> is inactivated as "L". The 4-th driving preliminary signal XPDR<4> may be activated according to activation of "H" of the 3-rd comparison decision signal XCOMD<3>.

The 1-st to 4-th driving latch parts 650<1:4> may be driven to provide the 1-st to 4-th driving control signal XCDR<1:4>.

The logic states of the 1-st to 4-th driving control signals XCDR<1:4> may depend on (or be associated with) the logic state of the corresponding 1-st to 4-th driving preliminary signals XPRD<1:4>, and may be latched in response to activation of "H" of the end pulse signal XPUL.

In summary, each of the 1-st to 4-th driving control signals XCDR<1:4> may be activated in case that the frequency of the input clock signal ICLK is included in the corresponding frequency range FRAG. See FIG. 13. For example, the k-th driving control signal XCDR<k> may be activated in case that the frequency of the input clock signal ICLK is included in the k-th frequency range FRAG<k>. Here 'k' may be a natural number from ' 1' to '4'.

Referring again to FIG. 1, each of the 1-st to 4-th operation circuits CIRDR<1:4> may be driven to drive the semiconductor memory device in an operating state (e.g., a predetermined or selectable operating state), in response to the activation of "H" of the corresponding 1-st to 4-th driving control signals XCDR<1:4>. For example, a k-th operation circuit CIRDR<k> may drive the semiconductor memory device in the predetermined operating state in response to the activation of "H" of the k-th driving control signal XCDR<k>.

The operating state of the semiconductor memory device specified by the driving control signal XCDR may be, for example, a DLL off state, a DLL enabled state, a self-refresh entry state, and a self-refresh end state.

In the semiconductor memory device of the disclosure having the above configuration, the operating state of the semiconductor memory device may be changed by detecting the frequency of the input clock signal ICLK. For example, in the semiconductor memory device of the disclosure, the operating state can be changed by detecting a frequency change of an input clock signal ICLK without an external mode register setting command.

As a result, according to the semiconductor memory device of the disclosure, the time required to change the operating mode may be reduced.

While the disclosure has been described with reference to the embodiments shown in the drawings, these embodiments are merely illustrative and it should be understood that various modifications and other equivalent embodiments can be derived by those skilled in the art on the basis of the embodiments.

It will be apparent to those skilled in the art that various modifications can be made to the above-described embodiments of the disclosure without departing from the spirit or scope of the disclosure. Thus, it is intended that the disclosure covers all such modifications provided they come within the scope of the appended claims and their equivalents.

What is claimed is:

1. A semiconductor memory device comprising:
   a frequency detection circuit that detects a frequency of an input clock signal generated during a measurement time and generates a frequency confirmation data having information on the frequency of the input clock signal, wherein a data value of the frequency confirmation data is associated with a logic state of a corresponding one of 1-st to n-th confirmation counting signals, and the frequency of the input clock signal is divided into 1-st to m-th frequency ranges which do not overlap each other and are increased;
   a status register that receives the frequency confirmation data and generates 1-st to m-th driving control signals, wherein the k-th driving control signal is activated in case that the frequency of the input clock signal is in the k-th frequency range; and
   1-st to m-th operating circuits, wherein a k-th operation circuit drives the semiconductor memory device in an operating state in response to activation of the k-th driving control signal, wherein
   'n' is a natural number greater than or equal to '2',
   'm' is a natural number greater than or equal to '2',
   'k' is a natural number from '1' to 'm', and
   the frequency detection circuit includes:
      a measurement enable generating part that generates a measurement enable signal, wherein the measurement enable signal is activated during the measurement time; and
      a frequency counting part that receives the input clock signal and the measurement enable signal, and generates the frequency confirmation data, wherein the frequency confirmation data includes information on a number of clocks of the input clock signal generated during activation of the measurement enable signal.

2. The semiconductor memory device of claim 1, wherein the measurement enable generating part includes:
   a fixing delay part that generates a fixing delay signal by delaying a signal input to the fixing delay part with a fixing delay time, wherein a phase of the signal input to the fixing delay part is associated with a phase of an oscillation signal; and an enable inversion part that generates the oscillation signal by inverting the fixing delay signal, and a phase of the measurement enable signal is associated with the phase of the oscillation signal.

3. The semiconductor memory device of claim 2, wherein the enable inversion part is enabled in response to activation of a start signal.

4. The semiconductor memory device of claim 2, wherein the measurement enable generating part further includes:

a fixing switch that provides the oscillation signal as the signal input to the fixing delay part in response to activation of a fixing switching signal;

a selection delay part that generates a selection delay signal by delaying the signal input to the selection delay part with a selection delay time, wherein the phase of the signal input to the selection delay part is associated with the phase of the oscillation signal; and a selection switch that provides the oscillation signal as the signal input to the selection delay part in response to activation of a selection switching signal.

5. The semiconductor memory device of claim 4, wherein the selection switching signal is an inverted signal of the fixing switching signal.

6. The semiconductor memory device of claim 1, wherein the frequency counting part includes:

1-st to n-th frequency counters that are enabled in response to activation of the measurement enable signal, and driven to generate 1-st to n-th preliminary counting signals, wherein the 1-st preliminary counting signal transitions according to a progress of one period of the input clock signal, and an i-th preliminary counting signal transitions according to a progress of one period of an (i−1)-th preliminary counting signal, and the n-th preliminary counting signal transitions according to a progress of one period of an (n−1)-th preliminary counting signal; and 1-st to n-th counting latch parts that generate the 1-st to n-th confirmation counting signals, wherein a logic state of the j-th confirmation counting signal is associated with a logic state of the j-th preliminary counting signal, and is latched in response to inactivation of the measurement enable signal, 'i' is a natural number from '2' to (n−1), and 'j' is a natural number from '1' to 'n'.

7. The semiconductor memory device of claim 6, wherein the 1-st frequency counting part includes:

a 1-st activation switch that transmits an inverted signal of a 1-st preliminary response signal in response to activation of the input clock signal;

a 1-st activation inverting part that is enabled in response to activation of the measurement enable signal, and is driven to invert and output a signal transmitted from the 1-st activation switch;

a 1-st inactivation switch that transmits a signal output from the 1-st activation inverting part in response to inactivation of the input clock signal; and a 1-st inactivation inverting part that is driven to output the 1-st preliminary response signal with inverting the signal transmitted by the 1-st deactivation switch, and a logic state of the 1-st preliminary counting signal is associated with a logic state of the 1-st preliminary response signal.

8. The semiconductor memory device of claim 6, wherein the i-th frequency counting part includes:

an i-th activation switch that transmits the inverted signal of an i-th preliminary response signal in response to activation of the i-th preliminary counting signal;

an i-th activation inverting part that is enabled in response to activation of the measurement enable signal, and is driven to invert and output a signal transmitted from the i-th activation switch;

an i-th inactivation switch that transmits a signal output from the i-th activation inverting part in response to inactivation of the (i−1)-th preliminary counting signal; and an i-th inactivation inverting part that is driven to output the i-th preliminary response signal with inverting the signal transmitted by the i-th deactivation switch, and a logic state of the i-th preliminary counting signal is associated with a logic state of the i-th preliminary response signal.

9. The semiconductor memory device of claim 6, wherein the n-th frequency counting part includes:

an n-th activation switch that transmits the inverted signal of an n-th preliminary response signal in response to activation of the (n−1)-th preliminary counting signal;

an n-th activation inverting part that is enabled in response to the activation of the measurement enable signal, and is driven to invert and output a signal transmitted from the n-th activation switch;

an n-th inactivation switch that transmits a signal output from the n-th activation inverting part in response to inactivation of the (n−1)-th preliminary counting signal; and an n-th inactivation inverting part that is driven to output the n-th preliminary response signal with inverting the signal transmitted by the n-th deactivation switch, and a logic state of the n-th preliminary counting signal is associated with a logic state of the n-th preliminary response signal.

10. The semiconductor memory device of claim 9, wherein the n-th frequency counting part further includes a one-way latching part that is driven to generate the n-th preliminary counting signal with receiving the n-th preliminary response signal, and the logic state of the n-th preliminary counting signal is latched according to the activation of the n-th preliminary response signal.

11. The semiconductor memory device of claim 10, wherein the one-way latching part includes:

a 1-st NOR gate that is driven to perform NOR operation of the n-th preliminary response signal and a preliminary latch signal;

a 2-nd NOR gate that is driven to generate the preliminary latch signal with inverting the output signal of the 1-st NOR gate in case that the measurement enable signal is activated; and an inverter that is driven to generate the i-th preliminary counting signal with inverting the output signal of the 1-st NOR gate.

12. The semiconductor memory device of claim 6, wherein a j-th counting latch part includes:

a j-th latch switch that is driven to transmit the j-th preliminary counting signal, and turned off in response to inactivation of the measurement enable signal; and a j-th confirmation latch part that is driven to generate the j-th confirmation counting signal with latching the signal transmitted by the j-th latch switch.

13. The semiconductor memory device of claim 1, wherein
the status register includes:
a reference data storing part that stores 1-st to (m−1)-th reference data, wherein data values of the 1-st to (m−1)-th reference data are sequentially increased, and each of the 1-st to (m−1)-th reference data includes 1-st to n-th reference bit signals, respectively;
a data comparing part that includes 1-st to (m−1)-th comparison decision parts which generate 1-st to (m−1)-th comparison decision signal, wherein the t-th comparison decision signal is activated as the data value of the frequency confirmation data is higher than the data value of the t-th reference data; and
a drive generating part that generates the 1-st to m-th driving control signals with using the 1-st to (m−1)-th comparison decision signals, and
't' is a natural number from '1' to '(m−1)'.

14. The semiconductor memory device of claim 13, wherein
the t-th comparison decision part of the data comparing part includes:
1-st to n-th comparison determining parts that generate 1-st to n-th comparison switching signals, wherein the n-th comparison switching signal is activated in case that a logical state of the n-th confirmation counting signal of the frequency confirmation data and a logical state of the n-th reference bit signal of the t-th reference data are different, and an r-th comparison switching signal is activated, in case that an (r+1)-th to an n-th comparison switching signal are deactivated, and a logic state of an r-th confirmation counting signal of the frequency confirmation data is different from a logic state of the r-th reference bit signal of the t-th reference data; and
1-st to n-th comparison switching parts, wherein a j-th comparison switching part provides a j-th confirmation counting signal of the frequency confirmation data as the t-th comparison decision signal in response to activation of the j-th comparison switching signal,
'r' is a natural number from '1' to '(n−1)', and
'j' is a natural number from '1' to 'n'.

15. The semiconductor memory device of claim 14, wherein a t-th comparison decision part of the data comparing part further includes a comparison latch part that latches a logic state of the t-th comparison decision signal.

16. The semiconductor memory device of claim 13, wherein
the drive generating part includes:
an end generation part that generates an end pulse signal, wherein the end pulse signal is activated as a pulse in response to inactivation of a measurement enable signal;
1-st to m-th driving preliminary parts that generate 1-st to m-th driving preliminary signals, wherein the 1-st driving preliminary signal is activated according to inactivation of the 1-st comparison decision signal, and an s-th driving preliminary signal is activated in case that an (s−1)-th comparison decision signal is activated and an s-th comparison decision signal is inactivated, and the m-th driving preliminary signal is activated according to activation of an (m−1)-th comparison decision signal; and
1-st to m-th driving latch parts that provide the 1-st to m-th driving control signals, wherein logic states of the 1-st to m-th driving control signals are associated with a logic state of 1-st to m-th driving preliminary signals, respectively, and are latched in response to activation of the end pulse signal, and
's' is a natural number from '2' to (m−1).

17. A method for determining operation state of a semiconductor memory device, the method comprising:
detecting, by a frequency detection circuit, a frequency of an input clock signal generated during a measurement time and generating a frequency confirmation data having information on the frequency of the input clock signal, wherein a data value of the frequency confirmation data is associated with a logic state of a corresponding one of 1-st to n-th confirmation counting signals, and the frequency of the input clock signal is divided into 1-st to m-th frequency ranges which do not overlap each other and are increased:
receiving, by a status register, the frequency confirmation data and generating 1-st to m-th driving control signals, wherein the k-th driving control signal is activated in case that the frequency of the input clock signal is in the k-th frequency range; and
driving, by a k-th operation circuit, the semiconductor memory device in an operating state in response to activation of the k-th driving control signal, wherein
'n' is a natural number greater than or equal to '2',
'm' is a natural number greater than or equal to '2',
'k' is a natural number from '1' to 'm', and
the frequency detection circuit includes:
a measurement enable generating part that generates a measurement enable signal, wherein the measurement enable signal is activated during the measurement time; and
a frequency counting part that receives the input clock signal and the measurement enable signal, and generates the frequency confirmation data, wherein the frequency confirmation data includes information on a number of clocks of the input clock signal generated during activation of the measurement enable signal.

18. The method of claim 17, wherein
the measurement enable generating part includes:
a fixing delay part that generates a fixing delay signal by delaying a signal input to the fixing delay part with a fixing delay time, wherein a phase of the signal input to the fixing delay part is associated with a phase of an oscillation signal; and
an enable inversion part that generates the oscillation signal by inverting the fixing delay signal, and
a phase of the measurement enable signal is associated with the phase of the oscillation signal.

* * * * *